United States Patent [19]

Takeda et al.

[11] 3,774,198

[45] Nov. 20, 1973

[54] GALVANO-MAGNETO EFFECT APPARATUS

[75] Inventors: Masaaki Takeda, Tokyo; Shyuichi Honda, Kanagawa, both of Japan

[73] Assignee: Denki Onkyo Co., Ltd., Tokyo, Japan

[22] Filed: Sept. 29, 1972

[21] Appl. No.: 293,548

[30] Foreign Application Priority Data

| | | |
|---|---|---|
| Sept. 30, 1971 | Japan | 46/88682 |
| Sept. 30, 1971 | Japan | 46/88684 |
| Feb. 3, 1972 | Japan | 46/14550 |
| Sept. 30, 1971 | Japan | 46/88683 |

[52] U.S. Cl. ............. 340/365 L, 197/98, 323/94 H, 338/32 H

[51] Int. Cl. .............. G06f 3/02

[58] Field of Search ............... 340/365 L; 323/94 H; 338/32 H; 317/235 H; 197/98

[56] References Cited

UNITED STATES PATENTS

| | | | |
|---|---|---|---|
| 3,611,358 | 10/1971 | Dalmasso | 340/365 L |
| 3,657,686 | 4/1972 | Masuda et al. | 340/365 L |
| 3,680,026 | 7/1972 | Masuda et al. | 340/365 L |

*Primary Examiner*—Thomas B. Habecker
*Assistant Examiner*—Robert J. Mooney
*Attorney*—James E. Armstrong et al.

[57] ABSTRACT

A galvano-magneto effect apparatus in which a plurality of moving yokes being combined with a fixed yoke to form a magnetic path are arranged in parallel between different magnetic pole surfaces of said fixed yoke containing magnets respectively, a plurality of galvano-magneto effect devices to which a magnetic flux is applied are provided between the moving yokes and fixed yoke and said moving yokes are adapted to independently move in parallel, whereby said devices are respectively operated by actuating said moving yokes selectively with selecting means.

25 Claims, 22 Drawing Figures

GALVANO-MAGNETO EFFECT APPARATUS

BACKGROUND OF THE INVENTION

The present invention relates to a switch type galvano-magneto effect apparatus employing galvano-magneto effect devices such as, for example, magneto-resistance effect devices or Hall effect devices.

Conventional apparatuses of this type have been such that one magnetic path was required for one push button. Accordingly, the electronic equipment such as, for example, a desk type electronic computer requiring a number of push buttons is disadvantageous because the numbers of magnetic paths and devices increase and therefore the production cost becomes large. In addition, such the equipment is also disadvantageous because it is difficult to make the characteristics of magnetic paths uniform if there is a large number of magnetic paths, the output characteristic of the apparatus differs with the magnetic path and the production processes become complicated for necessity of the compact design of the magnetic path along with compact construction of the apparatus.

Recently, a galvano-magneto effect apparatus has been proposed in which a plurality of gaps are formed in an annular magnetic path in a direction intersecting at a right angle to the direction of magnetic flux, a galvano-magneto effect device is fixed at the end surface of the yoke provided in said gap and a magnetic piece which moves in the gap in the direction of magnetic flux is provided in said gap, and said devices are selectively operated by selectively actuating said magnetic pieces with the selecting means. In this apparatus, the actuating levers which move said magnetic pieces are arranged in parallel and are adapted to rotate around the rotating shaft and select bars are arranged to overlap at a right angle to said actuating levers whereby the actuating levers are selectively actuated in accordance with operation of said select bars; therefore, the stroke necessary for selective actuation differs with the select bar, the depressing force felt by a finger becomes uneven, the magnetic flux to be applied to the devices is not completely interrupted when the select bars are depressed by a fixed pushing force. Accordingly, erroneous operation will be caused.

Furthermore, the apparatus is disadvantageous because it is necessary to provide a plurality of gaps in one magnetic path, high dimensional accuracy of parts is required and the magnetic reluctance of the magnetic path is large.

The present invention provides a galvano-magneto effect device which is capable of eliminating the disadvantages described above.

SUMMARY

A galvano-magneto effect apparatus comprising a fixed yoke which contains at least one magnet and forms a fixed portion of a closed magnetic path, a plurality of galvano-magneto effect devices such as, for example, magneto-resistance effect devices or Hall effect devices fixed at specified positions of an external surface of said fixed yoke, a plurality of moving yokes made of a magnetic material in which the free ends are positioned opposing to a pair of surfaces of said fixed yokes so that said closed magnetic path is formed and a magnetic flux is applied to said devices respectively, at least one portion of one moving yoke is arranged in parallel with another portion of another moving yoke, and the density of a magnetic flux to be applied respectively to said devices is varied in accordance with parallel movement of the moving yokes in a direction intersecting at a right angle to the direction of the magnetic flux, a supporting means which usually holds said moving yokes at specified positions and provides a returning force against the moving yokes in parallel movement, select bars at least one more than the number of said moving yokes which are provided on the parallel portions of said moving yokes so as to overlap at a right angle to the moving yokes and are usualy held by the resetting means so as not to move the moving yokes, and a selecting means which is provided at one of said moving yokes and select bars and selectively actuates the select bars with action against the resetting means for said select bars, wherein said moving yokes are moved in parallel by said select bars acting against the returning force of said supporting means and said selecting means is adapted so that a combination of moving yokes selected by each select bar is different from that of moving yokes selected by the rest of select bars.

BRIEF DESCRIPTION OF THE DRAWINGS

The apparatus according to the present invention is illustrated in detail by the accompanying drawings whereon.

DETAILED DESCRIPTION OF THE INVENTION

Figure 1:
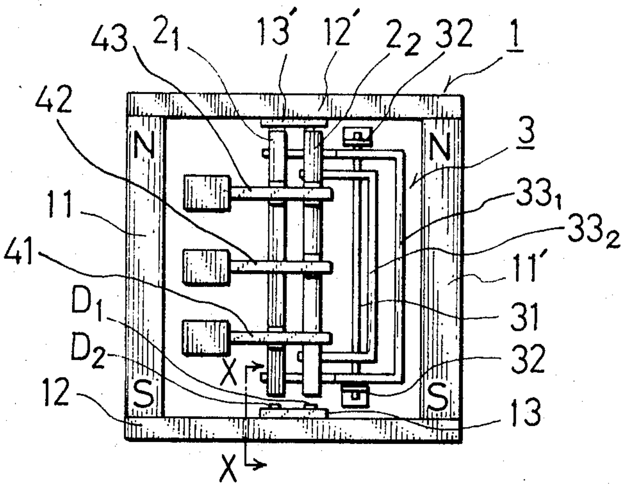
FIG. 1 is a plan view of an embodiment of the apparatus according to the present invention.

Referring to FIG. 1, there is shown an embodiment of the apparatus according to the present invention.

Fixed yoke 1 containing at least one magnet is formed so that same polar sides are opposed each other, whereby bar type magnets 11 and 11' being arranged in parallel so that the same polar sides of said magnets are aligned in the same direction are fixedly provided with a pair of yoke members 12 and 12' at the polar surfaces of their both ends so that said yoke members are positioned in parallel to connect the same polar sides of said magnets.

Magnetic flux concentrating yokes 13 and 13' made of long plate type magnetic material with a specified width are fixed to the surfaces opposing each other of yoke members 12 and 12' so that the lengthwise direction of magnetic flux concentrating yokes 13 and 13' are parallel with the lengthwise direction of yoke members 12 and 12'.

The magnetic flux concentrating yoke, as described, can be made by bonding a magnetic material different from yoke members 12 and 12' or can be integral with yoke members 12 and 12' as the projection.

Galvano-magneto effect devices $D_1$ and $D_2$ such as a magneto-resistance effect device or Hall effect device made of such as, for example, indium antimony, indium arsenic, etc. are provided at magnetic flux concentrating yoke 13 arranged in the lengthwise direction of said yoke 13, that is, along the lengthwise direction of yoke member 12.

Bar type moving yokes $2_1$ and $2_2$ made of a magnetic material are arranged in parallel between both magnetic flux concentrating yokes 13 and 13' so that both end faces of said moving yokes are opposed to magnetic flux concentrating yokes 13 and 13' and the same-side end faces of the moving yokes are opposed to magneto-resistance effect devices $D_1$ and $D_2$.

Support mechanism 3 which supports the moving yokes is provided under moving yokes $2_1$ and $2_2$.

Support mechanism 3 is comprised of supporting shaft 31 provided parallel with moving yokes $2_1$ and $2_2$, rests 32 provided at the fixed position to bear said supporting shaft and U-shaped rotary arms $33_1$ and $33_2$ made of a non-magnetic material which are rotatably mounted to supporting shaft 31.

Rotary arms $33_1$ and $33_2$ each having both ends 33*a* and 33'*a* passing through supporting shaft 31 are constructed so that they can individually rotate around supporting shaft 31 as the center. Both ends of moving yokes $2_1$ and $2_2$ are mounted on both end portions of rotary arms $33_1$ and $33_2$.

Hereupon, moving yokes $2_1$ and $2_2$ are supported by rotary arms $33_1$ and $33_2$ so that said moving yokes are respectively opposed to both concentrating yokes 13 and 13' in normal condition, and fixed yoke 1 and moving yokes $2_1$ and $2_2$ usually form a closed magnetic path. The concentrating magnetic flux passing through moving yokes $2_1$ and $2_2$ is applied to device $D_1$ and $D_2$.

Rotary arms $33_1$ and $33_2$ can be arranged so that said moving yokes usually maintain said condition and said rotary arms rotate downwardly when the moving yokes are depressed downward and return to the home position when the moving yokes are released from depression. Since a magnetic attracting force is active between each moving yoke and fixed yoke, the rotary arms can be arranged so that a force as large as it does not push up said moving yokes exceeding said magnetic attraction is usually active on the moving yokes, by appropriately balancing the weight of each rotary arm to be loaded onto supporting shaft 31.

In this arrangement, the rotary arms rotate downwardly when the moving yoke is depressed down and return the moving yoke to the home position by its own weight of the rotary arm and said magnetic attracting force when the moving yoke is released from depression, and thus, the rotary arms do not push up the moving yokes.

Figure 2A:
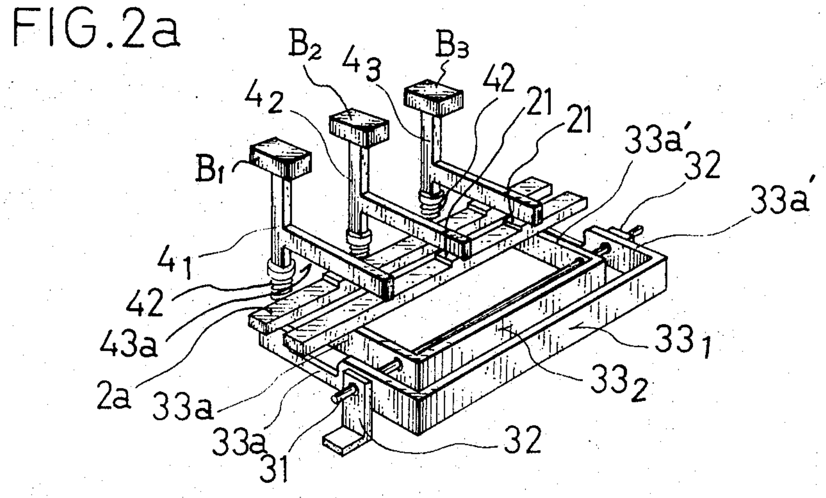
FIG. 2*a* is an isometric view of an important part of the embodiment shown in FIG. 1.
Figure 2B:
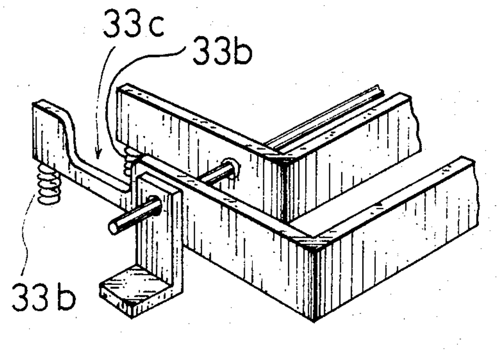
FIG. 2*b* is a magnified isometric view of an important part of another embodiment of the rotary arm shown in FIG. 2*a*.
Figure 2C:
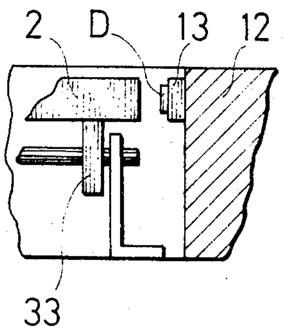
FIG. 2*c* is a cross sectional view of an important view as seen along line X—X in FIG. 1.

As shown in FIG. 2*b*, each rotary arm can be provided with reset springs 33*b* to return to the home position. In this case, the resetting force of the reset spring is set so as not to push up the moving yoke exceeding the original position.

Since each of the moving yokes is independently depressed down as described later, the rotary arms should be arranged so as not to obstruct downward movement of a moving yoke which is not mounted on said rotary arm; for example, the rotary arm can be provided with recessed portions 33*c* into which said moving yoke comes.

Three select bars $4_1$, $4_2$ and $4_3$ overlapping at a right angle to two moving yokes $2_1$ and $2_2$ are provided above said moving yokes. These select bars $4_1$, $4_2$ and $4_3$ are provided respectively with key tops $B_1$, $B_2$ and $B_3$ for depressing down the corresponding moving yokes and resilient members such as, for example, springs 42 for providing the resilient force against the depressing force, thus being constructed so that select bars overlapping at a right angle to said moving yokes are lowered in parallel when said key tops are depressed.

One of lower edge 43*a* of the select bar and upper surface 2*a* of moving yoke 2 is provided with a selecting means which causes selectively moving yokes $2_1$ and $2_2$ in accordance with the mathematical theory of the permutation and combination when the select bar is lowered.

The selecting means can be comprised of, for example, projections 21 provided at selected positions of the positions opposing to the select bars on upper surfaces 2*a* of moving yokes $2_1$ and $2_2$.

In the embodiment shown in FIG. 1, projections 21 are provided at positions opposing to select bars $4_1$ and $4_3$ in case of moving yoke $2_1$ and positions opposing to select bars $4_2$ and $4_3$ in case of moving yoke $2_2$.

Each device is provided with detecting circuit 5 which functions in accordance with operation of said device and the detecting circuit is connected to conversion circuit 6 which reads the operation of the detecting circuit and converts the readings into a specific signals.

The apparatus according to the present invention is as described above. In the embodiment shown in FIG. 1, when select bar $4_1$ is depressed down, lower edge 43*a* of select bar $4_1$ comes in contact with the projection provided at moving yoke $2_1$ and rotary arm $33_1$ which supports moving yoke $2_1$ rotates to cause moving yoke $2_1$ to lower. Since the select bars are usually arranged so as not to move exceeding the specified storke, select bar $4_1$ does not contact the upper surface of moving yoke $2_2$ and accordingly moving yoke $2_2$ does not lower.

Accordingly, moving yoke $2_1$ does not oppose to device $D_1$, the density of magnetic flux applied to device $D_1$ reduces and device $D_1$ operates. For example, if each device is comprised of a magneto-resistance effect device, the resistance value of device $D_1$ decreases.

Similarly, when select bar $4_2$ is depressed, moving yoke $2_2$ lowers and device $D_2$ functions. When select bar $4_3$ is depressed, moving yokes $2_1$ and $2_2$ lower and devices $D_1$ and $D_2$ function.

If two moving yokes are provided as described above, three types of signals can be generated by functioning of two devices which are respectively provided on said yokes so as to oppose each other.

Figure 3:
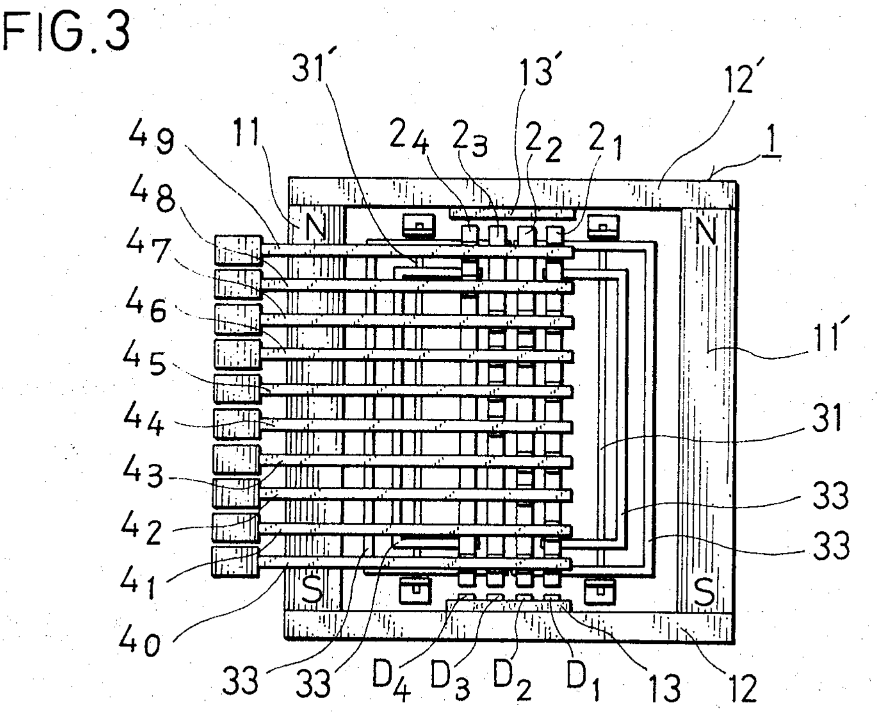
FIG. 3 is a plan view of another embodiment of the apparatus.

Referring to FIG. 3, there is shown an embodiment in which four moving yokes $2_1$, $2_2$, $2_3$ and $2_4$ are provided respectively opposing to galvano-magneto effect devices $D_1$, $D_2$, $D_3$ and $D_4$.

If four moving yokes are provided, selective arrangement of projections at the moving yokes results in 15 kinds of movements of the moving yokes in total, that is, four kinds of movements are obtained in which the moving yokes operate individually when the select bar is lowered, six kinds of movements in which two moving yokes operate simultaneously, four kinds of movements in which three moving yokes move simultaneously and one kind of movement in which four moving yokes operate. Accordingly, the combination signals from the devices are available in 15 types, maximum (or 16 types if one type signal exists when the devices do not function). Therefore, maximum 15 select bars can be provided and the projections corresponding to the select bars can be selectively provided. Since general electronic computers have the keyboards employing the decimal codes, the apparatus can be provided with ten select bars as shown in the embodiment.

Moving yokes $2_1$, $2_2$, $2_3$ and $2_4$ being arranged in parallel each other are supported respectively by rotary arms 33, and the half of rotary arms 33 are mounted on supporting shaft 31 in parallel with the moving yokes and the remaining half of rotary arms are mounted on supporting shaft 31' arranged symmetrically to supporting shaft 31 in reference to the moving yokes as the center. Yoke members 12 and 12' of fixed yokes 1 are provided with magnetic flux concentrating yokes 13 and 13' as in case of said embodiment and one magnetic flux concentrating yoke 13 is provided with galvano-magneto effect devices $D_1$, $D_2$, $D_3$ and $D_4$ at the positions opposed to corresponding moving yokes. Ten select bars $4_0$, $4_1$, $4_2$, —, $4_9$ are arranged so that the select bars overlap at a right angle to all moving yokes. In addition, a plural number of projections 21 are provided at selected positions of the opposing positions to the select bars on the upper surface of moving yokes $2_1$, $2_2$, $2_3$ $2_4$.

Figure 4:
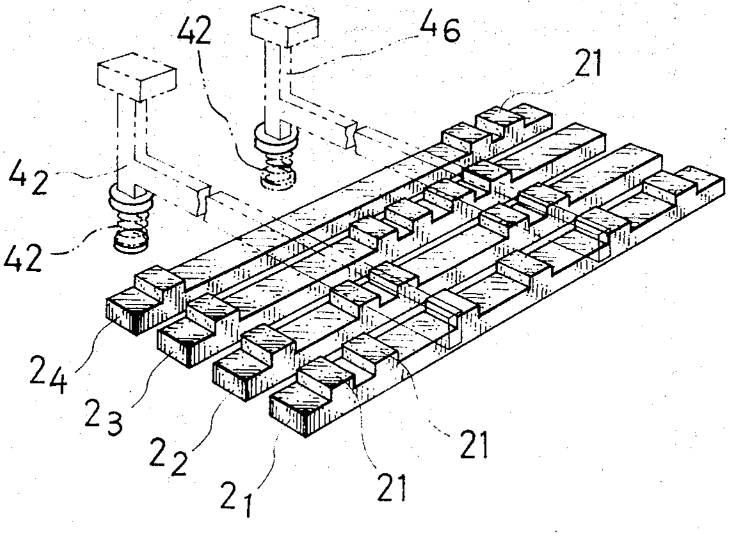
FIG. 4 is an isometric view of an important part of the apparatus shown in FIG. 3.

The projections can be provided at the positions corresponding to the moving yokes in a different combination as viewed from the select bars as shown, for example, in FIG. 4.

Thus, as in said embodiment, when the select bars are depressed down, one or more than two selected moving yokes are lowered and the device corresponding to each moving yoke is actuated.

Detecting circuit 5 can be formed in any configuration. If the devices are the magneto-resistance effect devices, the detecting circuit is preferred to be connected to the bases of the corresponding transistors so that the transistors function with variation of the resistance value of the devices.

Figure 5:
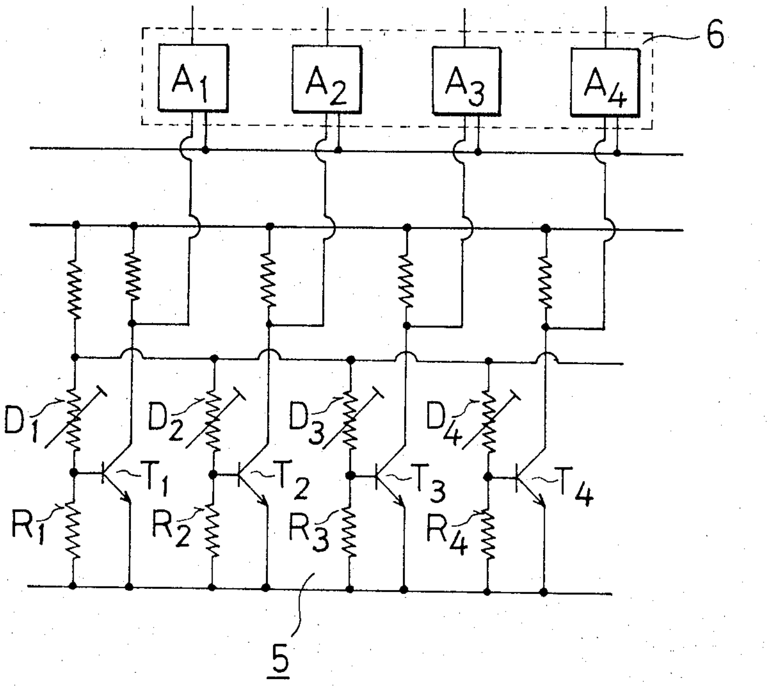
FIG. 5 is a circuit diagram illustrating an example of the detecting circuit of the apparatus shown in FIG. 3.

FIG. 5 shows an example of such the circuit as described above. In this example, devices $D_1$, $D_2$, $D_3$ and $D_4$ are connected respectively to the bases of NPN type transistors $T_1$, $T_2$, $T_3$ and $T_4$ and function to raise the base voltage of the transistors in accordance with decrease of the resistance value of the devices.

In this case, accordingly, when the moving yokes are selectively lowered by depressing the select bars from the state that the magnetic flux is usually concentrated onto the devices, the magnetic flux is not concentrated onto the devices to which the moving yokes are opposed, the resistance value of the devices decreases and the transistors connected to the devices function.

The relationship between the devices and transistors differs with the types of transistors and the configuration of magnetic circuits. If the PNP type transistors are employed or the moving yokes are not usually opposed to the devices and the moving yokes cause the magnetic flux to be selectively concentrated onto the devices, the devices can be inserted into the place of bias resistors $R_1$, $R_2$, $R_3$ and $R_4$ and the bias resistors can be contrarily inserted into the place of the devices.

The collectors of said transistors $T_1$, $T_2$, $T_3$ and $T_4$ are respectively connected to $2^0$ signal amplifier $A_1$ generating the $2^0$ signal, $2^1$ signal amplifier $A_2$ generating the $2^1$ signal, $2^2$ signal amplifier $A_3$ generating the $2^2$ signal and $2^3$ signal amplifier $A_4$ generating the $2^3$ signal, and these amplifiers form conversion circuit 6.

This conversion circuit 6 is connected to the logic circuit and the arithmetic operation circuit and is adapted to convert the code signals generated from said amplifiers into special numerical values and to perform calculation.

Which numerical value a signal code signal or combined code signals supplied from said conversion circuit correspond to has been determined by a similar means through a logic circuit and arithmetic operations of these numerical values are performed by a known means in the arithmetic operation circuit. Accordingly, the detailed description is omitted.

This embodiment is as described above. When select bar $4_1$ is operated, moving yoke $2_1$ lowers individually and does not oppose to device $D_1$ whereby the concentrating magnetic flux is not applied to device $D_1$. When the concentrating magnetic flux is not applied to device $D_1$, the resistance value of the device decreases, the base voltage of transistor $T_1$ rises to cause transistor $T_1$ to become on-state and $2^0$ signal amplifier $A_1$ is operated.

Accordingly, if the numerical value corresponding to the $2^0$ signal is determined in advance as 1 in the logic circuit, a signal of numeral 1 is supplied from the logic circuit to the arithmetic operation circuit.

Similarly, when select bar $4_2$ is operated, moving yoke $2_2$ lowers individually to cause device $D_2$ to function and to cause transistor $T_2$ to become on-state and them $2^1$ signal amplifier operates.

Accordingly, if the numerical value corresponding to the $2^1$ signal is determined as 2 in advance in the logic circuit, a signal of numeral 2 is supplied from the logic circuit to the arithmetic circuit.

Similarly, when select bar $4_4$ or $4_8$ is operated, device $D_3$ or $D_4$ functions and the $2^2$ signal amplifier or $2^3$ signal amplifier circuit operates. Accordingly, if the numerical value corresponding to $2^2$ or $2^3$ signal is determined as 4 or 8, this numeral is supplied to the arithmetic operation circuit in the same manner.

When select bar $4_6$ is operated, moving yokes $2_2$ and $2_3$ lower at the same time and $2^1$ signal amplifier $A_2$ and $2^2$ signal amplifier $A_3$ operate to supply the $2^1$ and $2^2$ signals to the logic circuit. Accordingly, numeral 6 is supplied to the arithmetic operation circuit by the combined signals.

Said combinations are determined so that select bars $4_1, 4_2, —, 4_9$ correspond to numerical values 1, 2, –, 9 and the amplifier circuits operate while being combined with the numerical values in accordance with the rules of binary coded decimal codes. Select bar $4_0$ is determined so that all amplifier circuits operate corresponding to numerical value 0. As a matter of course, the combinations can be determined as desired, not depending on said method. Correspondence between combinations and numerical values can be determined in the logic circuit.

Hereupon, the apparatus according to the present invention can be constructed as described below.

Figure 6:
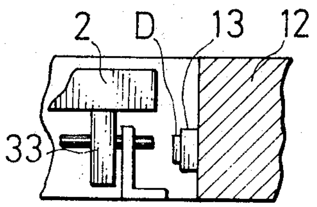
FIG. 6 is a magnified cross sectional view of an important part illustrating an embodiment of the arranging position of the galvano-magnetro effect device.

As shown in FIG. 6, moving yoke 2 can be adapted so that it is not usually opposed to device D and becomes opposed to device D when it is lowered by a select bar, thus causing the magnetic flux to be concentrated onto device D.

Figure 7:
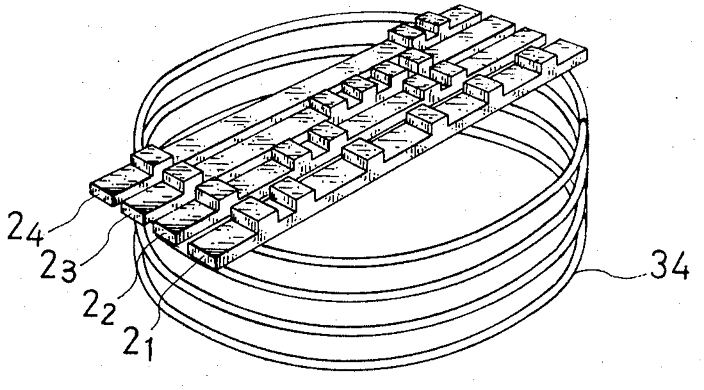
FIG. 7 is an isometric view of an important part of an embodiment of the supporting means.

As shown in FIG. 7, support mechanism 3 can be comprised of large-diameter coil springs 34 which support all moving yokes $2_1$, $2_2$, $2_3$ and $2_4$ from underside altogether. This spring is adapted so that it usually holds the moving yokes and provides the returning force to return the moving yoke when the moving yoke is depressed down, while the magnetic force of the magnets, the weight of the moving yokes or the distance between the fixed yokes and moving yokes is properly adjusted so that the initial positions are maintained by the attracting force between the moving yokes and fixed yokes.

In this case, when, for example, one magnetic yoke is lowered by depressing down a select bar, other yokes are held at the original positions by magnetic attracting force. When the select bar is released from a depressing force, the moving yoke is returned to the home position by the magnetic attracting force and the resetting force of the spring.

In this configuration, the force depressing the select bar is equivalent when one moving yoke is depressed and all moving yokes are depressed. Accordingly, the depressing force by a finger is equal at every select bar and therefore abnormality due to unevenness of forces required for operating the select bars is eliminated.

Figure 8:
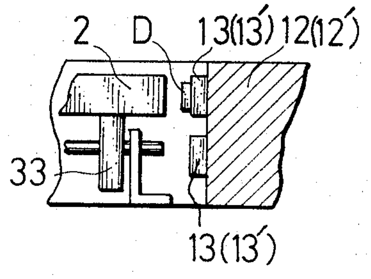
FIG. 8 is a magnified cross sectional view of an important part illustrating an embodiment of the magnetic flux concentrating yoke.

Yoke members 12 and 12' of fixed yoke 1 can be provided respectively with at least two magnetic flux concentrating yokes 13 and 13' as shown in FIG. 8. These magnetic flux concentrating yokes are arranged respectively at a position where they are opposed to the moving yokes in a usual state when moving yoke 2 is not depressed and a position below said position where they are opposed to the moving yokes when moving yoke 2 is depressed by select bar 12. In this configuration, as the moving yoke lowers, the magnetic flux passing through the upper magnetic flux concentrating yoke changes its flowing direction and is suddenly concentrated onto the lower magnetic flux concentrating yoke. Accordingly, the magnetic flux applied to device D provided at the upper magnetic flux concentrating yoke suddenly decreases and the resistance value of the device suddenly reduces, thus improving the rise characteristic of the output of the apparatus.

Figure 9A:
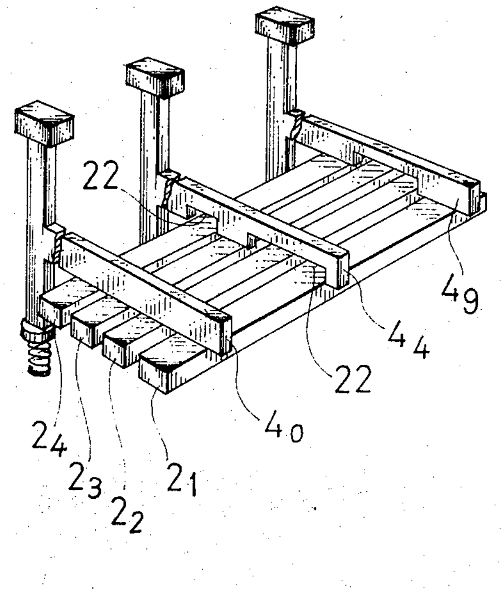
FIGS. 9*a* to 9*d* are isometric views of important parts illustrating an embodiment of the selecting means.

The selecting means which selectively lowers the moving yoke when a select bar is lowered can be comprised of recessed portions 22 provided at a selected position of lower edge 43 of the select bar as shown in FIG. 9*a*. Recessed portions 22 are adapted to have such construction that the moving yoke is not lowered by entering the moving yoke into a recessed portion when the select bar is lowered. In other words, the recessed portion is provided at the positions on each select bar opposed to the moving yoke which is not lowered by said select bar.

Figure 9B:
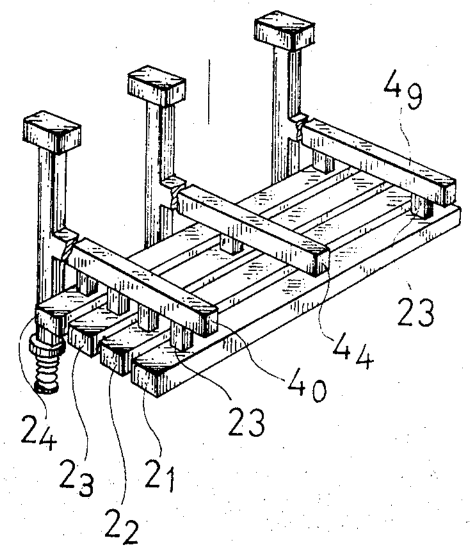

Furthermore, said selecting means can be comprised, as shown in FIG. 9*b*, of projecting parts 23 which are provided at the positions selected to lower the moving yoke and are projected downward.

Figure 9C:
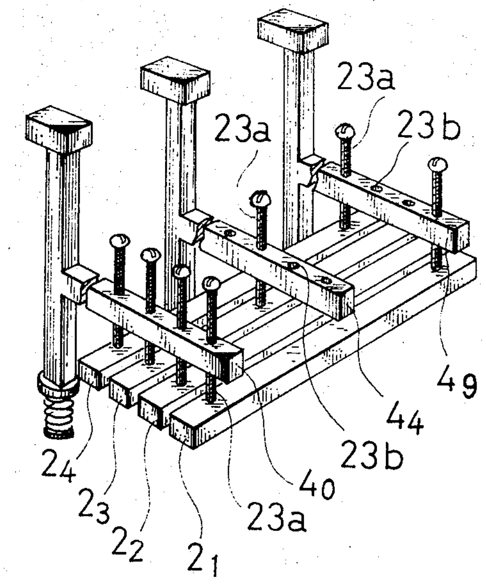

If the selecting means is thus comprised of a projecting means, screw 23*a* can be employed as said projecting part by screw-mounting it so that it projects from the lower surface of select bar 4 as shown in FIG. 9*c*. In this case, all select bars are provided with screw holes 23*b* at the positions corresponding to the moving yokes and the screws are screwed in only selected screw holes. Accordingly, it is extremely easy to form the select bars and selecting means. Furthermore, the length of the projecting part can be adjusted as desired.

Figure 9D:
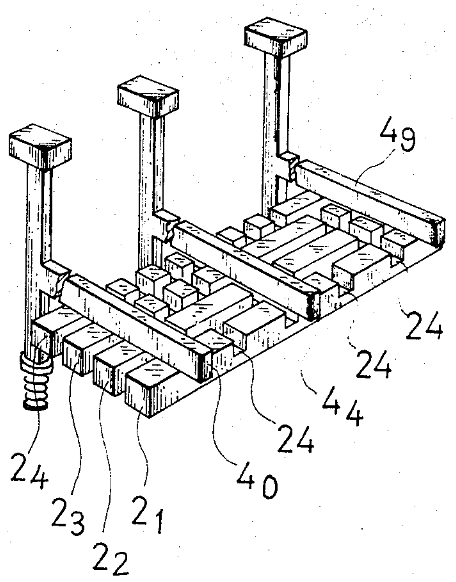

Furthermore, as shown in FIG. 9*d*, said selecting means can be comprised of slot 24 provided in parallel with the select bar on the upper surface of moving yoke. Slot 24 is constructed so that a select bar fits into it when the select bar is depressed and the moving yoke is not lowered.

The group of said select bars comprises the following select bars.

The group of select bars requires at least one select bar which actuates a plurality of moving yokes at the same time.

In other words, the maximum number of select bars which actuate respectively different moving yokes is equal to the number of the moving yokes and, in this case, therefore the number of select bars cannot be larger than that of the moving yokes.

Various conditions add to this condition in accordance with the number of the moving yokes.

The following describes in detail the above.

First, if one select bar selects a plurality of moving yokes in combination, at least two select bars select respectively one moving yoke. This is adapted to all cases in which more than two moving yokes are employed.

Second, if one select bar respectively selects one moving yoke, one condition is required that at least three select bars should select a plurality of the moving yokes in combination so that the above relationship cannot be given in the case that two moving yokes are selected.

Third, if more than two select bars respectively select one moving yoke, the number of select bars which select a plurality of moving yokes in combination can be at least two, thereby the above relationship cannot be given in the case that two moving yokes are selected.

Fourth, the apparatus can be constructed so that each select bar selects a plurality of moving yokes and actuates them at the same time. In this case, more than three moving yokes are also required.

Figure 10A:
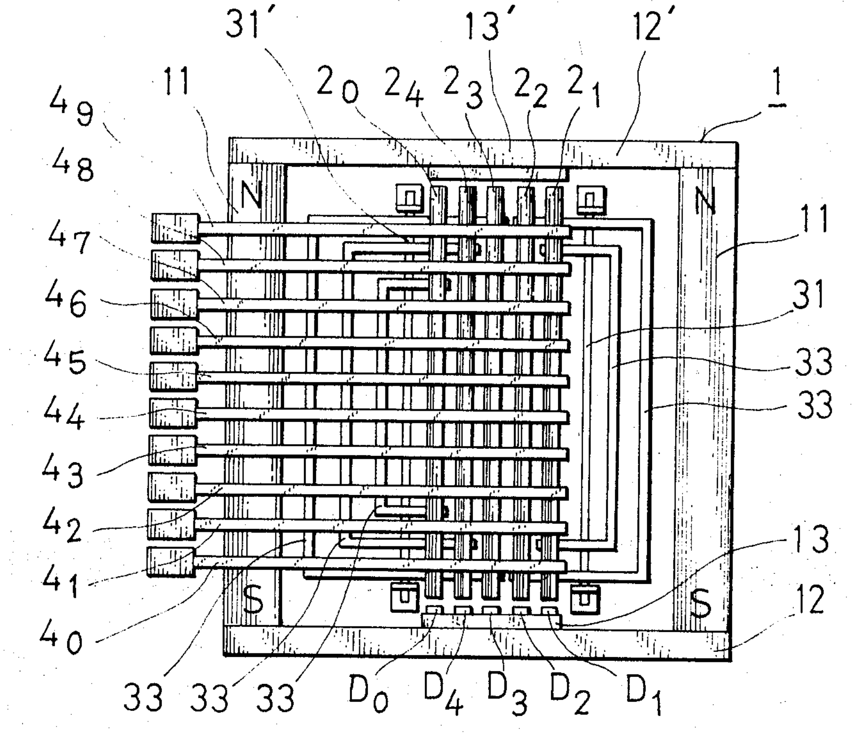
FIG. 10*a* is a plan view illustrating an embodiment of the apparatus provided with the strobe signal generating mechanism.
Figure 10B:
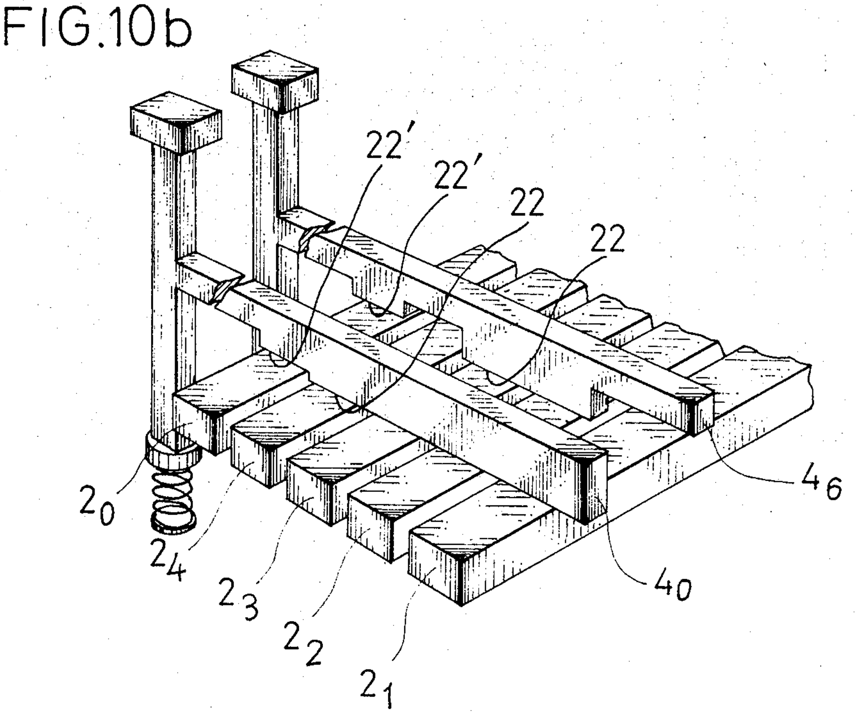
FIG. 10*b* is a magnified isometric view of the apparatus shown in FIG. 10*a*.

The apparatus is provided with the strobe signal generating mechanism which generates the strobe signals for simultaneously generating the numerical signals. This mechanism, as shown in FIGS. 10*a* and 10*b*, is comprised of strobe signal generating moving yoke $2_0$ being aligned with numerical signal generating moving yokes $2_1$, $2_2$, $2_3$ and $2_4$, galvano-magneto effect device $D_0$ for the strobe being opposed to moving yoke $2_0$ and aligned with devices $D_1$, $D_2$, $D_3$ and $D_4$ for generating said numerical signals so that the magnetic flux is applied to device $D_0$, a plurality of actuating means being provided at said select bars $4_0$, $4_1$, —, $4_9$ or moving yokes for the strobe signals in order to actuate said moving yokes for strobe signals, a strobe signal detecting circuit for detecting the function of device $D_0$. Moving yoke $2_0$ for the strobe signal is supported by supporting mechanism 3 as moving yokes $2_1$, $2_2$, $2_3$ and $2_4$ for said numerical signals. Said actuating means can be adapted to operate later than the moving yokes for numerical signals which are selected and actuated by the select bar when any select bar is operated. As shown in the figure, the actuating means can be formed in contact edge 22' which depresses the select bar and comes in contact with the upper surface of moving yoke $2_0$ for the strobe and the gap formed between said contact edge and moving yoke $2_0$ can be slightly wider than the gap formed between the upper surfaces of other moving yokes $2_1$, $2_2$, $2_3$ and $2_4$ and depressing edge 22 for actuating the numerical signal generating moving yoke.

Strobe signal detecting circuit $5_0$ can be formed similarly to detecting circuit 5 for said numerical signals. If the magneto-resistance effect device is employed as the galvano-magneto effect device, the strobe signal detecting circuit is preferred to be adapted to actuate the transistor with variation of the resistance value of device $D_0$ connected to the base of the transistor.

Figure 11A:
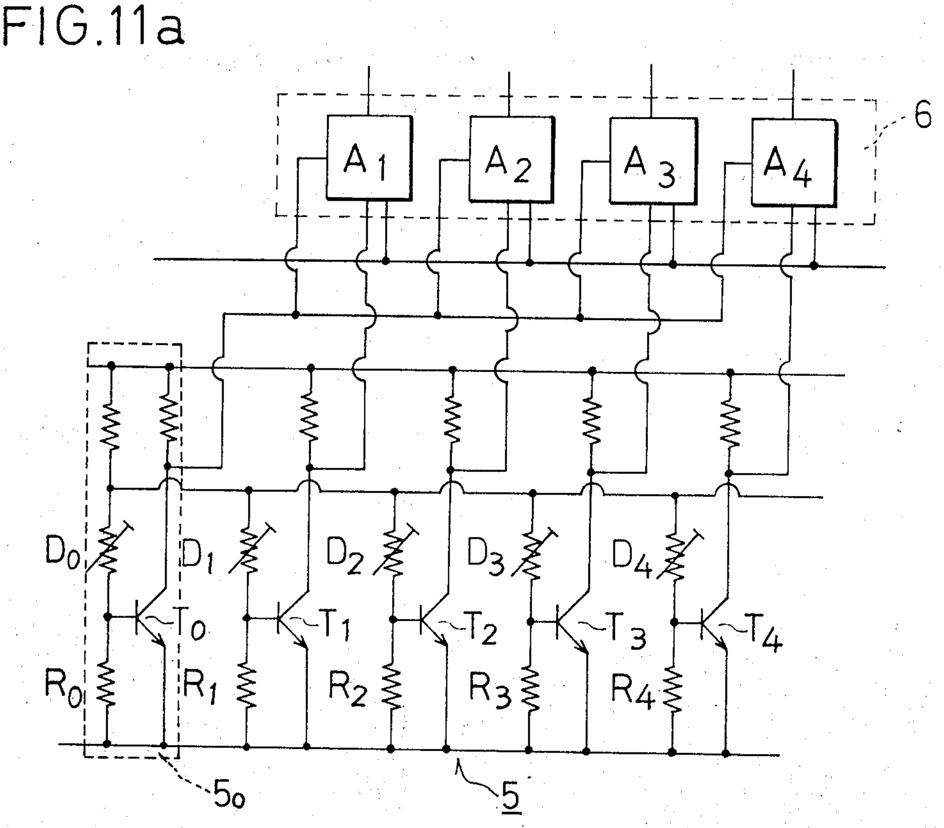
FIG. 11*a* is a circuit diagram illustrating the detecting circuit of an apparatus shown in FIG. 10*a*.

FIG. 11*a* shows an example of such strobe signal detecting circuit $5_0$. In this example, device $D_0$ is connected to the base of NPN type transistor $T_0$ and the base voltage of the transistor is raised by reduction of the resistance value of device $D_0$.

Accordingly, when the select bar is depressed down from the state that the magnetic flux is usually applied to the device, moving yoke $2_0$ for the strobe signal is lowered, the density of the magnetic flux applied to the device $D_0$ for the strobe signal reduces and the resistance value of device $D_0$ reduces, thus causing transistor $T_0$ to function.

Figure 11B:
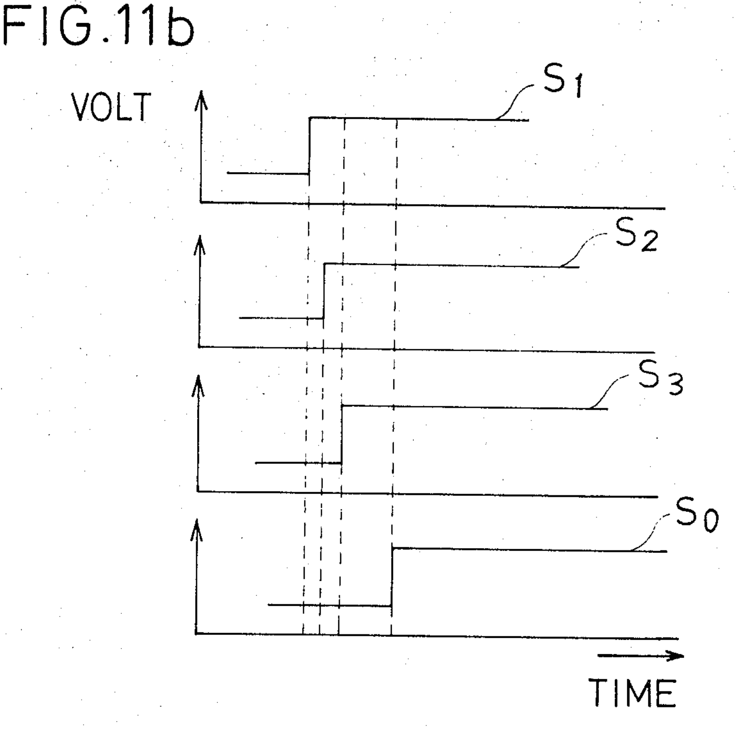
FIG. 11*b* is an explanatory diagram of the operation of the apparatus shown in FIG. 10*a*, and FIGS. 12*a* to 12*d* are respectively magnified isometric views illustrating an embodiment of the actuating means to be employed in the strobe signal generating mechanism.

In the above description, when the select bar is depressed down, selected moving yokes $2_1$, $2_2$, $2_3$ and $2_4$ for the numerical signals operate and the moving yokes $2_0$ for the strobe signals operate later than the moving yokes for the numerical signals. Accordingly, the resistance value of device $D_0$ for the strobe signal reduces later than each device for the numerical signal. In other words, strobe signal $S_0$ is generated with a certain time lag later than numerical signals $S_1$, $S_2$ and $S_3$ as shown in FIG. 11*b*.

If signal amplifiers $A_1$, $A_2$, $A_3$ and $A_4$ are adapted to operate when said strobe signal is inputted, the signal from said signal amplifying circuit is outputted when the strobe signal is inputted and therefore the rise time of both signals is matched. Such adaptation of the signal amplifiers is well known and therefore, the detailed description is omitted.

If the strobe signal generating mechanism is provided as described above, all the numerical signals can be generated at the same time.

The devices do not start functioning at the same time because the select bars do not move in parallel with the moving yokes, the parts may show the difference in the mechanical accuracy, the springs may show the difference in the resilient force and the parts and devices may show the error in the mounting accuracy. Accordingly, the difference of the rise time of the output signal occurs. If said strobe signal generating means is provided, the phase difference in the rise of the signals can be eliminated by controlling the phase difference of each numerical signal with a strobe signal.

Said actuating means can be comprised as described below in accordance with the design of the selecting means.

Figure 12A:
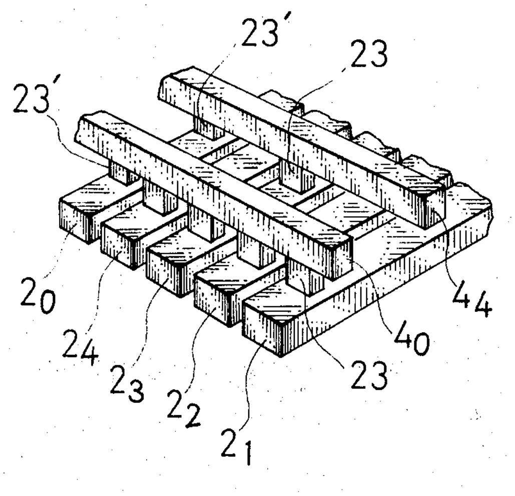

As shown in FIG. 12*a*, if the select bars are provided with projecting parts 23 as the selecting means, projecting parts 23' a specified length shorter than said projecting parts 23 can be provided on the select bars at positions opposed to moving yoke $2_0$ for the strobe signal.

When screws 23*a* are employed as projecting parts 23, screws a specified length shorter than said screws can be provided on the select bars at positions opposed to moving yoke $2_0$ for the strobe signal.

Figure 12B:
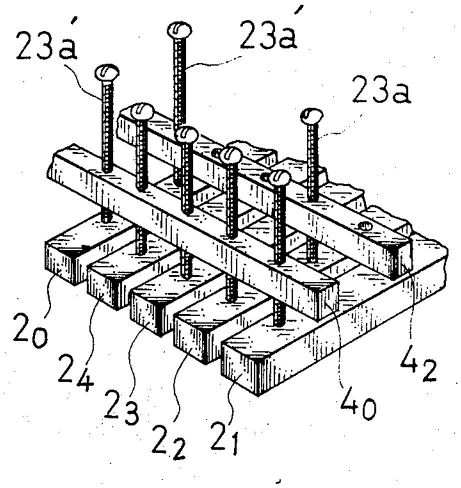

When screws 23*a* are employed as projecting parts 23, screws a specified length shorter than said screws can be provided on the select bars at positions opposed to moving yoke $2_0$ for the strobe signal or, as shown in FIG. 12*b*, screws 23*a'* with the same length as said screws can be employed to adjust their projecting length.

Figure 12C:
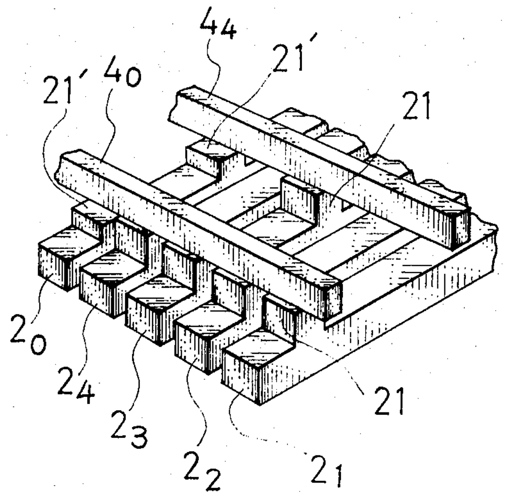
Figure 12D:
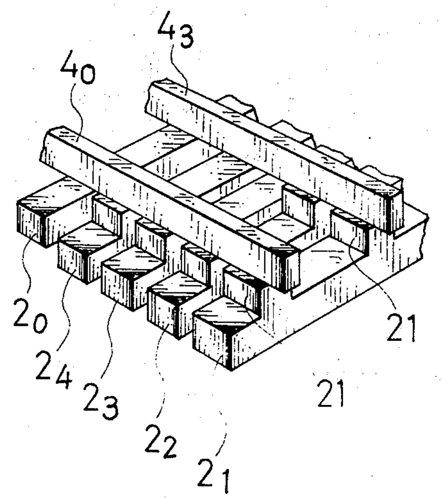

If projections 21 are provided as a selecting means on the moving yoke, projections 21' lower than said projections 21 can be provided at positions of moving yoke $2_0$ for the strobe signal opposed to the select bars as shown in FIG. 12*c* or, as shown in FIG. 12*d*, said moving yoke $2_0$ can be provided so that it is usually held at a position nearer the select bars than other moving yokes and lower than the upper surface of projections 21 of the moving yokes.

The designs of said actuating means can be combined and always need not be identical to the design of said selecting means.

The apparatus according to the present invention is as described above and provides such effects as described below.

A number of different signals can be obtained from a small number of devices according to the theory of mathematical permutation and combination and therefore the number of expensive devices can be saved and the circuit construction is simplified, thus making it possible to reduce the production cost of the apparatus.

The input from each key top can be directly binary-coded and the circuit construction of the coding mechanism can be simplified.

Since the number of magnets can be extremely reduced, the output characteristic of the devices can be uniformly designed, the apparatus can be compacted, large magnets can be employed because the number of magnets to be employed is few, and therefore the density of the magnetic flux flowing in the magnetic path can be increased.

Since the moving yokes are adapted to move in parallel, the strokes at all select bars for operating the moving yokes are equal, the depressing force by a finger is uniform, the magnetic flux density varies constantly and erroneous operating is prevented.

What is claimed is:

1. A galvano-magneto effect apparatus comprising:

a. a fixed yoke containing at least one magnet and forming a fixed part of a closed magnetic path, b. a plurality of galvano-magneto effect devices being aligned at specified positions on the surface of said fixed yoke, c. a plurality of moving parallel yokes made of a magnetic material wherein each of said moving yokes is combined with said fixed yoke to form part of said closed magnetic path, the free ends of said moving yokes respectively opposed to said fixed yoke in order to apply the magnetic flux respectively to said devices and said moving yokes and moving in parallel in the direction intersecting at a right angle to the direction of magnetic flux between said moving yokes and fixed yoke to vary the density of the magnetic flux to be applied to said devices, d. a supporting means for holding said moving yokes at the specified positions and providing a returning force for the moving yokes which have moved from their normal position, e. a plurality of select bars made of non-magnetic material which are arranged to overlap said moving yokes at a right angle and resetting means for holding said select bars so that the moving yokes are not normally moved wherein the number of select bars is at least one more than said moving yokes, f. a selecting means, provided at at least one of said moving yokes and selected bars, for selecting and actuating the moving yokes by action of said select bar, and g. a detecting circuit which detects individually the change in state of said galvano-magneto effect devices, wherein said moving yokes are moved in parallel by the action of said select bars against the returning force of said supporting means and a combination of moving yokes selected by each select bar is different from that of moving yokes selected by the others of said select bars.

2. An apparatus according to claim 1, wherein said supporting means is adapted to have rotary arms which independently rotate at the rotation axis in parallel with the parallel parts of said moving yokes, each of the moving yokes being mounted at the end of said rotary arms.

3. An apparatus according to claim 2, wherein said rotary arms are adapted to provide the returning force obtained from balancing of the weight of the rotary arm to said moving yokes.

4. An apparatus according to claim 2, wherein said rotary arms are provided respectively with the resetting springs which provide the returning force to said moving yokes.

5. An apparatus according to claim 1, wherein said supporting means comprises a large-diameter coil spring on which said moving yokes are mounted.

6. An apparatus according to claim 1, wherein at least one magnetic flux concentrating yoke of a magnetic material and having a specified width in the direction of movement of said moving yoke is provided at a position opposing said moving yoke on the surface of said fixed yoke.

7. An apparatus according to claim 6, wherein said galvano-magneto effect devices are mounted on said concentrating yoke.

8. An apparatus according to claim 6, wherein at least one pair of said magnetic flux concentrating yokes are aligned in the direction of of movement of said moving yokes.

9. An apparatus according to claim 1, wherein said selecting means comprises a plurality of projecting parts provided on each moving yoke so that the projecting parts are opposed to the select bars which select the moving yokes.

10. An apparatus according to claim 1, wherein said selecting means comprises a plurality of depressing edges, each being formed adjacent a plurality of recessed portions which are provided at each select bar so as to be opposed to the moving yoke which is not selected by the select bar.

11. An apparatus according to claim 1, wherein said selecting means comprises a plurality of projecting parts provided at the select bars so that said projecting parts are opposed to said moving yokes to be selected.

12. An apparatus according to claim 11, wherein said projecting parts comprise screws being mounted in the select bar.

13. An apparatus according to claim 1, wherein said selecting means comprise a plurality of grooves provided on moving yokes so that said grooves are opposed to select bars which do not select the moving yokes.

14. An apparatus according to claim 1, wherein said galvano-magneto effect devices are adapted so that the concentrating magnetic flux is normally applied to said moving yoke.

15. An apparatus according to claim 1, wherein said galvano-magneto effect devices are adapted so that the concentrating magnetic flux is applied to said moving yoke at a position away from the normal position.

16. An apparatus according to claim 1 which is provided with a strobe signal generating mechanism comprising:

i. at least one strobe signal galvano-magneto effect device aligned at a specified position of the surface of said fixed yoke, ii. at least one moving yoke for said strobe signal made of a magnetic material which has both free ends opposed to said fixed yoke wherein said moving yoke is combined with said fixed yoke to form part of said closed magnetic path and a magnetic flux is applied to said galvano-magneto effect device for the strobe signal, is aligned with other said moving yokes so that at least a portion of said moving yoke is parallel with a portion of the other moving yokes, and changes the density of the magnetic flux to be applied to said galvano-magneto effect device for the strobe signal through parallel movement in a direction intersecting at a right angle to the direction of the magnetic flux between said moving yoke and fixed yoke, iii. a supporting means for normally holding said moving yoke for the strobe signal at the specified position and for providing a returning force against said moving yoke, iv. a delay actuating means provided at at least one side of said moving yoke and at the select bar side for actuating said moving yoke for the strobe signal by action of said select bars with a delay time even when other moving yokes are selected and actuated by action of any one of said select bars, and v. a strobe signal detecting circuit which detects the change of state of said galvano-magneto effect devices for the strobe signal and generates the strobe signal wherein said moving yoke for the strobe signal is moved in parallel by action of said select bars after the other moving yokes against the returning force of said supporting means.

17. A apparatus according to claim 16, wherein said delay actuating means comprises contact edges opposed to the moving yoke for the strobe signal and provided at all selected bars so as to have a specified distance from said moving yoke for the strobe signal.

18. An apparatus according to claim 16, wherein said delay actuating means comprises projecting parts provided on all select bars so that said projecting parts are opposed to said moving yoke for the strobe signal and a specified distance exists between the extreme ends of the projecting parts and said moving yoke.

19. An apparatus according to claim 18, wherein said projecting parts comprise a screw.

20. An apparatus according to claim 16, wherein said delay actuating means comprises at least one projection being provided on said moving yoke for the strobe signal so that said projecting is opposed to each select bar.

21. An apparatus according to claim 16, wherein said delay actuating means is formed by said moving yoke for the strobe signal being normally held a specified distance nearer said select bars than other moving yokes.

22. An apparatus according to claim 1, wherein said plurality of select bars comprises at least two select bars which respectively select one moving yoke and one select bar which selects a plurality of moving yokes in combination.

23. An apparatus according to claim 1, wherein said plurality of select bars comprises one select bar which selects a predetermined moving yoke and at least three select bars which select a plurality of moving yokes in combinations.

24. An apparatus according to claim 1, wherein said plurality of select bars comprises at least two select bars which respectively select one moving yoke and at least two other select bars which select a plurality of moving yokes in combinations.

25. An apparatus according to claim 1, wherein said plurality of select bars comprises at least four select bars which select a plurality of moving yokes in combinations.

* * * * *